(12) United States Patent
Kazuno et al.

(10) Patent No.: US 11,376,770 B2
(45) Date of Patent: Jul. 5, 2022

(54) METHOD OF MANUFACTURING ELECTRONIC DEVICE

(71) Applicant: SEIKO EPSON CORPORATION, Tokyo (JP)

(72) Inventors: Masataka Kazuno, Kofu (JP); Tetsuya Otsuki, Fujimi-Machi (JP)

(73) Assignee: Seiko Epson Corporation, Tokyo (JP)

( * ) Notice: Subject to any disclaimer, the term of this patent is extended or adjusted under 35 U.S.C. 154(b) by 37 days.

(21) Appl. No.: 16/783,431

(22) Filed: Feb. 6, 2020

(65) Prior Publication Data

US 2020/0254663 A1 Aug. 13, 2020

(30) Foreign Application Priority Data

Feb. 8, 2019 (JP) .............................. JP2019-021642

(51) Int. Cl.
| | |
|---|---|
| *B29C 45/14* | (2006.01) |
| *H05K 5/06* | (2006.01) |
| *G01P 3/44* | (2006.01) |
| *B29L 31/34* | (2006.01) |
| *B29K 63/00* | (2006.01) |

(52) U.S. Cl.
CPC .. *B29C 45/14655* (2013.01); *B29C 45/14467* (2013.01); *G01P 3/44* (2013.01); *H05K 5/065* (2013.01); *B29K 2063/00* (2013.01); *B29L 2031/34* (2013.01)

(58) Field of Classification Search
None
See application file for complete search history.

(56) References Cited

U.S. PATENT DOCUMENTS

| | | | | |
|---|---|---|---|---|
| 5,577,319 | A * | 11/1996 | Knecht | H01L 23/24 257/687 |
| 5,578,261 | A * | 11/1996 | Manzione | B29C 45/14655 264/272.15 |
| 6,038,136 | A * | 3/2000 | Weber | H01L 21/563 174/260 |
| 6,319,450 | B1 * | 11/2001 | Chua | B29C 45/14655 257/787 |
| 6,324,069 | B1 * | 11/2001 | Weber | H01L 21/563 174/260 |
| 6,413,801 | B1 * | 7/2002 | Lin | H01L 21/565 257/E21.504 |

(Continued)

FOREIGN PATENT DOCUMENTS

| | | |
|---|---|---|
| JP | S60-182141 | 9/1985 |
| JP | H02-271641 | 11/1990 |
| JP | H11-121487 | 4/1999 |

*Primary Examiner* — Edmund H Lee
(74) *Attorney, Agent, or Firm* — Workman Nydegger

(57) ABSTRACT

A method of manufacturing an electronic device includes a step of housing an electronic component in a metal mold, then filling the metal mold with a molding material, wherein the metal mold includes a cavity having a rectangular planar shape and housing the electronic component, and a dummy cavity communicated with a side surface having the smallest gap with the electronic component out of four side surfaces included in the cavity, and in the step of filling the metal mold with the molding material, the molding material inflows into the cavity, and the molding material in the cavity inflows into the dummy cavity.

6 Claims, 9 Drawing Sheets

(56) References Cited

U.S. PATENT DOCUMENTS

| | | | | |
|---|---|---|---|---|
| 6,495,083 B2* | 12/2002 | Weber | .................... | H01L 21/563 |
| | | | | 257/E21.503 |
| 6,555,924 B2* | 4/2003 | Chai | ....................... | B29C 45/34 |
| | | | | 257/667 |
| 6,656,773 B2* | 12/2003 | Boyaud | ................. | H01L 21/565 |
| | | | | 257/E21.503 |
| 6,867,487 B2* | 3/2005 | Huang | ................. | H01L 21/565 |
| | | | | 257/687 |
| 6,956,296 B2* | 10/2005 | Boyaud | ................. | H01L 21/565 |
| | | | | 257/778 |
| 6,988,882 B2* | 1/2006 | Boyaud | ................. | H01L 21/565 |
| | | | | 257/E21.504 |
| 2001/0038166 A1* | 11/2001 | Weber | .................... | H01L 21/565 |
| | | | | 264/272.15 |
| 2002/0101006 A1* | 8/2002 | Prior | ....................... | B29C 70/72 |
| | | | | 264/272.17 |
| 2003/0153130 A1* | 8/2003 | Kuratomi | ................ | H01L 24/97 |
| | | | | 438/123 |
| 2012/0146236 A1* | 6/2012 | Lin | .................... | H01L 23/49838 |
| | | | | 257/774 |
| 2014/0291881 A1* | 10/2014 | Jang | ................. | B29C 45/14655 |
| | | | | 264/102 |

* cited by examiner

METHOD OF MANUFACTURING ELECTRONIC DEVICE

The present application is based on, and claims priority from JP Application Serial Number 2019-021642, filed Feb. 8, 2019, the disclosure of which is hereby incorporated by reference herein in its entirety.

BACKGROUND

1. Technical Field

The present disclosure relates to a method of manufacturing an electronic device.

2. Related Art

In JP-A-2-271641 (Document 1), for example, there is disclosed a configuration in which a cavity for housing an electronic component, a dummy cavity for drawing resin, and a flow channel for coupling a resin flow channel terminal part in the cavity and the dummy cavity to each other are provided to a mold for resin mold in order to suppress occurrence of a void when performing resin mold of the electronic component. Further, in Document 1, there is described that the void which is apt to occur in the resin flow channel terminal part in the cavity can be made to inflow into the dummy cavity via the flow channel to thereby manufacture a package without a void by using the mold having such a configuration.

However, in the mold described above, although there is a possibility that the occurrence of the void can effectively be suppressed when performing the resin mold of an electronic component which is small in asperity and has a relatively simple flow channel made of a molding material in the cavity, it is difficult to induce the void to the dummy cavity when performing the resin mold of an electronic component which has a complicated shape and has a complicated flow channel made of the molding material in the cavity, and thus, it is difficult to suppress the occurrence of the void.

SUMMARY

An aspect of the present disclosure is directed to a method of manufacturing an electronic device having at least one electronic component covered with a molded part, the method including a step of housing a first electronic component in a metal mold, then filling the metal mold with a molding material to form the molded part, wherein the metal mold includes a cavity having a rectangular planar shape and housing the first electronic component, and a first dummy cavity communicated with a side surface having the smallest gap with the first electronic component out of four side surfaces included in the cavity, and in the step of filling the metal mold with the molding material, the molding material inflows into the cavity, and the molding material in the cavity inflows into the first dummy cavity.

In the above aspect of the present disclosure, the first dummy cavity may be communicated with a corner located in one end of the side surface having the smallest gap with the first electronic component.

In the above aspect of the present disclosure, the electronic device may further include a second electronic component covered with the molded part, the metal mold may further include a second dummy cavity communicated with a side surface having a smallest gap with the second electronic component out of the four side surfaces included in the cavity, and in the filling the metal mold with the molding material, the molding material may inflow into the cavity, and the molding material in the cavity may inflow into the second dummy cavity.

In the above aspect of the present disclosure, the electronic device may further include a third electronic component, defining the four side surfaces as a first side surface, a second side surface coupled to one end of the first side surface, a third side surface coupled to another end of the first side surface, and a fourth side surface coupled to the second side surface and the third side surface, the first electronic component may be disposed inside the cavity so that a gap with the first side surface becomes the smallest, the second electronic component may be disposed inside the cavity so that a gap with the second side surface becomes the smallest, the third electronic component may be disposed inside the cavity so that a gap with the third side surface becomes the smallest, and the metal mold may include the first dummy cavity communicated with the first side surface, the second dummy cavity communicated with the second side surface, and a third dummy cavity communicated with the third side surface.

In the above aspect of the present disclosure, the metal mold may include an inflow channel communicated with a corner located between the third side surface and the fourth side surface to allow the molding material to inflow into the cavity.

In the above aspect of the present disclosure, the electronic component may include a package and a sensor element housed in the package.

DESCRIPTION OF AN EXEMPLARY EMBODIMENT

Hereinafter, a method of manufacturing an electronic device according to the present disclosure will be described in detail based on an embodiment shown in the accompanying drawings.

Figure 1:
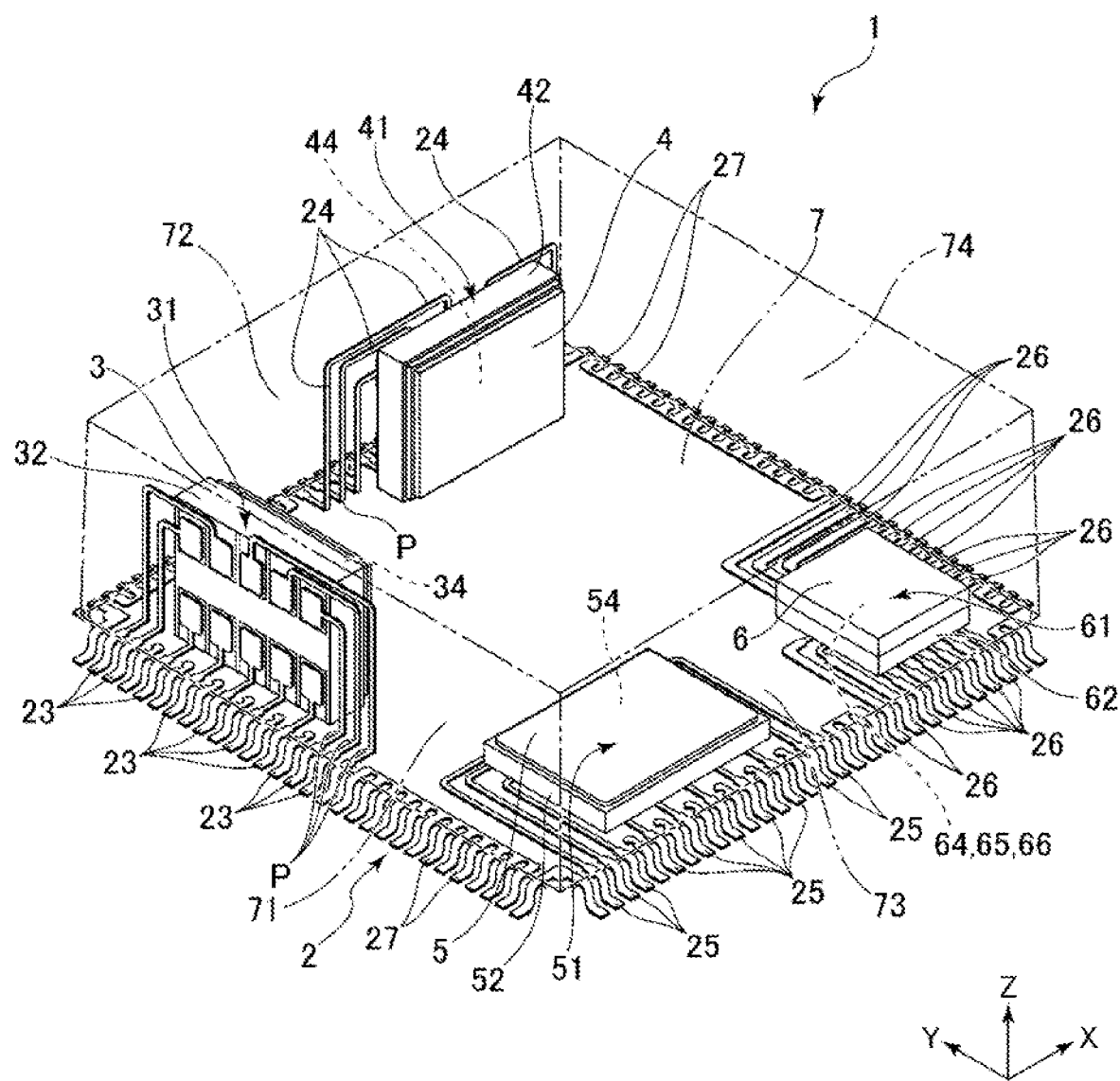
FIG. 1 is a perspective view showing an outline of an electronic device.
Figure 2:
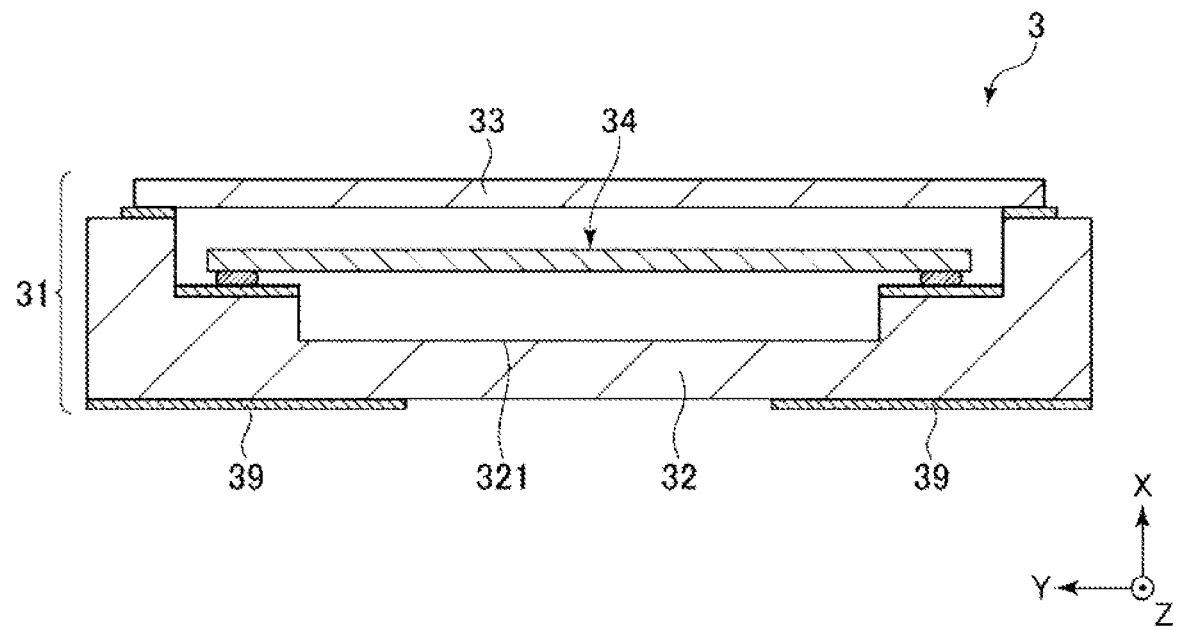
FIG. 2 is a cross-sectional view showing an example of an electronic component.
Figure 3:
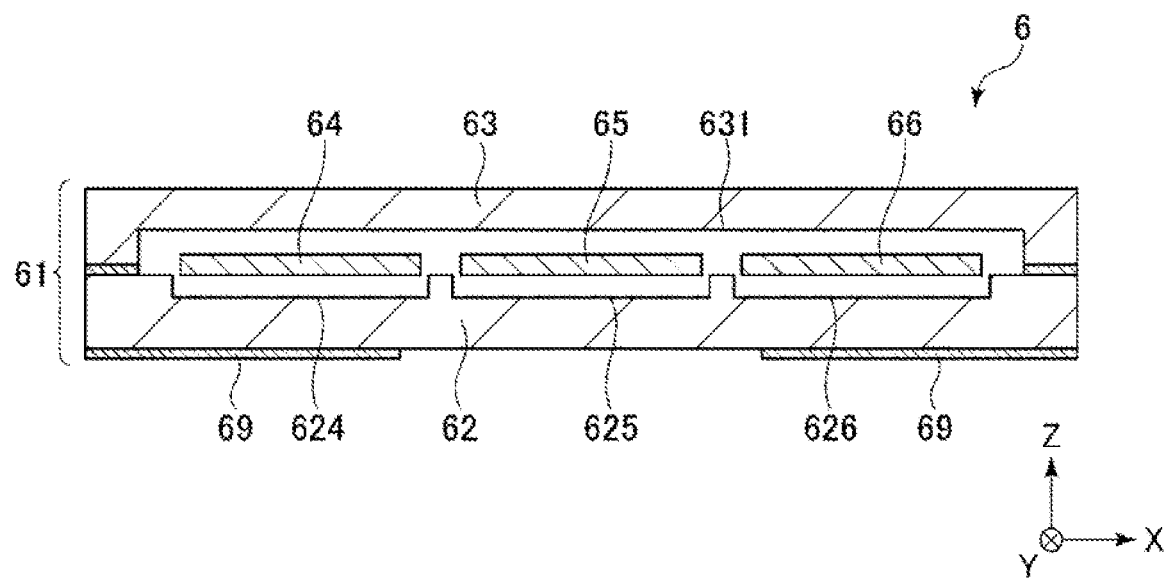
FIG. 3 is a cross-sectional view showing an example of the electronic component.
Figure 4:
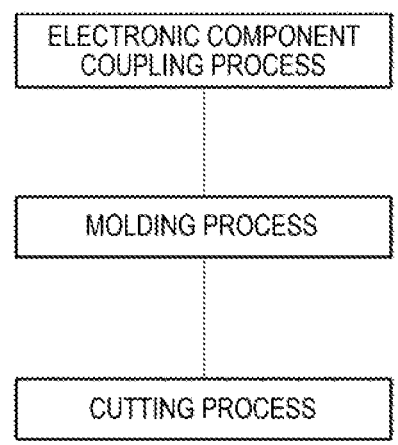
FIG. 4 is a diagram showing a manufacturing process of the electronic device shown in FIG. 1.

FIG. 1 is a perspective view showing an outline of the electronic device. FIG. 2 and FIG. 3 are each a cross-sectional view showing an example of an electronic component. FIG. 4 is a diagram showing a manufacturing process of the electronic device shown in FIG. 1. FIG. 5 through FIG. 10 are each a diagram for describing the method of manufacturing the electronic device shown in FIG. 1.

It should be noted that in each of the drawings except FIG. 4, there are illustrated three axes perpendicular to each other as an X axis, a Y axis, and a Z axis for the sake of convenience of explanation. A direction parallel to the X axis is also referred to as an "X-axis direction," a direction parallel to the Y axis is also referred to as a "Y-axis direction," and a direction parallel to the Z axis is referred to as a "Z-axis direction." Further, the tip side of an arrow representing each of the axes is also referred to as a "positive side," and the opposite side is also referred to as a "negative side." Further, the positive side in the Z-axis direction is also referred to as "above," and the negative side in the Z-axis direction is also referred to as "below."

Firstly, the electronic device 1 manufactured using the method of manufacturing the electronic device according the present embodiment will briefly be described. As shown in FIG. 1, the electronic device 1 has a lead group 2 provided with a plurality of leads, an electronic component 3 as a first electronic component, an electronic component 4 as a second electronic component, an electronic component 5 as a third electronic component, and an electronic component 6 as a fourth electronic component coupled to the lead group 2, and a molded part 7 which molds these four electronic components 3, 4, 5, and 6.

The molded part 7 molds the electronic components 3, 4, 5, and 6 to protect the electronic components 3, 4, 5, and 6 from moisture, dust, an impact, and so on. A molding material constituting the molded part 7 is not particularly limited, and there can be used thermoset resin such as epoxy resin or phenol resin. Further, the method of forming the molded part 7 is not particularly limited, and the molded part 7 can be formed using, for example, a transfer mold method.

Such a molded part 7 forms a rectangular shape (a quadrangular shape) in a plan view from the Z-axis direction. Therefore, side surfaces of the molded part 7 include a first side surface 71, a second side surface 72, a third side surface 73, and a fourth side surface 74. Further, the first side surface 71 and the fourth side surface 74 are disposed so as to be opposed to each other in the X-axis direction, and the second side surface 72 and the third side surface 73 are disposed so as to be opposed to each other in the Y-axis direction. It should be noted that the rectangular shape has meaning of including a shape which can be identified with a rectangular shape in light of common sense although slightly deformed from a rectangular shape besides a shape coinciding with a rectangular shape. As the "shape which can be identified with a rectangular shape in light of common sense," there can be cited, for example, a shape having a minute error which can occur in manufacturing, a shape with at least one corner chamfered or rounded, a shape with at least one corner slightly different from 90°, and a shape with at least one side not shaped like a straight line but curved in the middle or in the entire area. Further, it is also possible for the first side surface 71, the second side surface 72, the third side surface 73, and the fourth side surface 74 to be provided with a slightly tapered shape. Thus, it is possible to easily and surely perform separation from a metal mold 8 described later.

The electronic components 3, 4, 5, and 6 are each a sensor component. Specifically, among the electronic components 3, 4, 5, and 6, the electronic component 3 is an X-axis angular velocity sensor for detecting the angular velocity around the X axis, the electronic component 4 is a Y-axis angular velocity sensor for detecting the angular velocity around the Y axis, the electronic component 5 is a Z-axis angular velocity sensor for detecting the angular velocity around the Z axis, and the electronic component 6 is a triaxial acceleration sensor for independently detecting the acceleration in the X-axis direction, the acceleration in the Y-axis direction, and the acceleration in the Z-axis direction. In other words, the electronic device 1 according to the present embodiment is a six-axis composite sensor.

It should be noted that the configuration of the electronic device 1 is not limited to the above, but it is also possible to omit at least one of the electronic components 3, 4, 5, and 6, or it is also possible to add another electronic component. Further, each of the electronic components 3, 4, 5, and 6 is not limited to the sensor component.

Then, the electronic components 3, 4, and 5 will briefly be described. These electronic components 3, 4, and 5 are the same in configuration, and are arranged tilted as much as 90° from each other so that the postures thereof correspond to the respective detection axes. Therefore, the electronic component 3 will hereinafter be described as a representative, and the description of the electronic components 4, 5 will be omitted.

As shown in FIG. 2, the electronic component 3 has a package 31 and a sensor element 34 housed in the package 31. The package 31 is constituted by, for example, a base 32 having a recessed part 321, and a lid 33 bonded to the base so as to close an opening of the recessed part 321. A plurality of external terminals 39 is disposed on a lower surface of the base 32, and the external terminals 39 are each electrically coupled to the sensor element 34. The sensor element 34 is, for example, a quartz crystal vibrator element having drive arms and vibrating arms. When the angular velocity is applied in the state in which the drive arms are made to perform a drive vibration, a detection vibration is excited in the detection arms due to the Coriolis force, and it is possible to obtain the angular velocity based on the charge generated in the detection arms due to the detection vibration.

Although the electronic component 3 is hereinabove described, the configuration of the electronic component 3 is not particularly limited providing the function can be exerted. For example, the sensor element 34 is not limited to the quartz crystal element, but can also be, for example, a silicon vibrator element, and can be provided with a configuration of detecting the angular velocity based on the variation of the capacitance. Further, although in the present embodiment, the electronic components 3, 4, and 5 are the same in configuration, this is not a limitation, and it is also possible to adopt a configuration in which at least one is different from the others. Further, the electronic component 3 can also be provided with a configuration capable of detecting not only the angular velocity around the X axis but also the angular velocity around the other axes such as the Y axis and the Z axis in addition to the X axis. For example, when the electronic component 3 has the configuration which is capable of detecting the angular velocity around the X axis and the Y axis, the electronic component 4 can be omitted, and when the electronic component 3 has the configuration capable of detecting the angular velocity around the X axis, the Y axis, and the Z axis, the electronic component 4 and the electronic component 5 can be omitted.

Then, the electronic component 6 will briefly be described. As shown in FIG. 3, the electronic component 6 has a package 61 and sensor elements 64, 65, and 66 housed in the package 61. The package 61 has a base 62 having recessed parts 624, 625, and 626 formed so as to overlap the sensor elements 64, 65, and 66, and a lid 63 which has a recessed part 631 opening on the base 62 side, and is bonded to the base 62 so as to house the sensor elements 64, 65, and 66 in the recessed part 631. A plurality of external terminals 69 is disposed on a lower surface of the base 62, and the external terminals 69 are each electrically coupled to the sensor elements 64, 65, and 66.

Further, the sensor element 64 is an element for detecting the acceleration in the X-axis direction, the sensor element 65 is an element for detecting the acceleration in the Y-axis direction, and the sensor element 66 is an element for detecting the acceleration in the Z-axis direction. These sensor elements 64, 65, and 66 are each a silicon vibrator element having a stationary electrode, and a movable electrode which forms a capacitance with the stationary electrode, and is replaced with respect to the stationary electrode when the acceleration in the detection axis direction is received. Therefore, it is possible to detect the acceleration in the X-axis direction based on the variation of the capacitance of the sensor element 64, it is possible to detect the acceleration in the Y-axis direction based on the variation of the capacitance of the sensor element 65, and it is possible to detect the acceleration in the Z-axis direction based on the variation of the capacitance of the sensor element 66.

Although the electronic component 6 is hereinabove described, the configuration of the electronic component 6 is not particularly limited providing the function can be exerted. For example, each of the sensor elements 64, 65, and 66 is not limited to the silicon vibrator element, but can also be, for example, a quartz crystal vibrator element, and can be provided with a configuration of detecting the acceleration based on the charge generated by the vibration.

Among these four electronic components 3, 4, 5, and 6, the electronic component 3 is disposed along the first side surface 71 of the molded part 7 so as to be biased toward the second side surface 72 side on the first side surface 71. The electronic component 3 can also be said to be disposed on the corner between the first side surface 71 and the second side surface 72. Further, the electronic component 3 is disposed in a posture in which the lower surface of the base 32 faces to the first side surface 71.

The electronic component 4 is disposed along the second side surface 72 of the molded part 7 so as to be biased toward the fourth side surface 74 side on the second side surface 72. The electronic component 4 can also be said to be disposed on the corner between the second side surface 72 and the fourth side surface 74. Further, the electronic component 4 is disposed in a posture in which a lower surface of a base 42 faces to the second side surface 72.

The electronic component 5 is disposed along the third side surface 73 of the molded part 7 so as to be biased toward the first side surface 71 side on the third side surface 73. The electronic component 5 can also be said to be disposed on the corner between the first side surface 71 and the third side surface 73. Further, the electronic component 5 is disposed in a posture in which a lower surface of a base 52 faces to the lower surface of the molded part 7, and the lower surface of the base 52 and the lower surface of the molded part 7 are parallel to each other.

The electronic component 6 is disposed on the corner between the third side surface 73 and the fourth side surface 74. The electronic component 6 is disposed in a posture in which the lower surface of the base 62 faces to the lower surface of the molded part 7, and the lower surface of the base 62 and the lower surface of the molded part 7 are parallel to each other.

According to such an arrangement, since it is possible to dispose the electronic components 3, 4, 5, and 6 so as to be distributed to the respective corners of the molded part 7, the electronic components 3, 4, 5, and 6 can regularly be arranged in a smaller space. Therefore, reduction in size of the electronic device 1 can be achieved. It should be noted that the arrangement of the electronic components 3, 4, 5, and 6 is not limited to the arrangement described above.

Then, the lead group 2 will be described. As shown in FIG. 1, the lead group 2 includes a plurality of leads 23 coupled to the electronic component 3, a plurality of leads 24 coupled to the electronic component 4, a plurality of leads 25 coupled to the electronic component 5, and a plurality of leads 26 coupled to the electronic component 6. Further, the lead group 2 includes a plurality of leads 27 electrically coupled to none of the electronic components 3, 4, 5, and 6.

Further, the electronic component 3 and each of the leads 23, the electronic component 4 and each of the leads 24, the electronic component 5 and each of the leads 25, and the electronic component 6 and each of the leads 26 are each coupled mechanically and electrically to each other via an electrically conductive bonding material (not shown) such as solder. Further, one end of each of the leads 23, 24, 25, 26, and 27 projects outside the molded part 7, and attachment to an external device is achieved in these parts.

Further, the lead group 2 is generally arranged along an X-Y plane including the X axis and the Y axis. Further, each of the leads 23 coupled to the electronic component 3 is folded as much as 90° toward the Z-axis direction at a folding point P in the middle of the lead 23 in order to make the detection axis of the electronic component 3 coincide with the X axis. Similarly, each of the leads 24 coupled to the electronic component 4 is folded as much as 90° toward the Z-axis direction at a folding point P in the middle of the lead 24 in order to make the detection axis of the electronic component 4 coincide with the Y axis. In contrast, each of the leads 25 coupled to the electronic component 5 and each of the leads 26 coupled to the electronic component 6 are not folded like the leads 23, 24 in the molded part 7, but extend along the X-Y plane. Each of the leads 27 coupled to none of the electronic components 3, 4, 5, and 6 is not folded like the leads 23, 24 in the molded part 7, but extends along the X-Y plane.

The electronic device 1 is briefly described hereinabove. Then, a method of manufacturing the electronic device 1 will be described. As shown in FIG. 4, the method of manufacturing the electronic device 1 includes an electronic component coupling process of coupling the electronic components 3, 4, 5, and 6 to a lead frame 20, a molding process of filling the metal mold 8 with the molding material housing the electronic components 3, 4, 5, and 6 in the metal mold 8 to thereby form the molded part 7, and a cutting process of cutting to remove unnecessary parts of the lead frame 20.

Electronic Component Coupling Process

Figure 5:
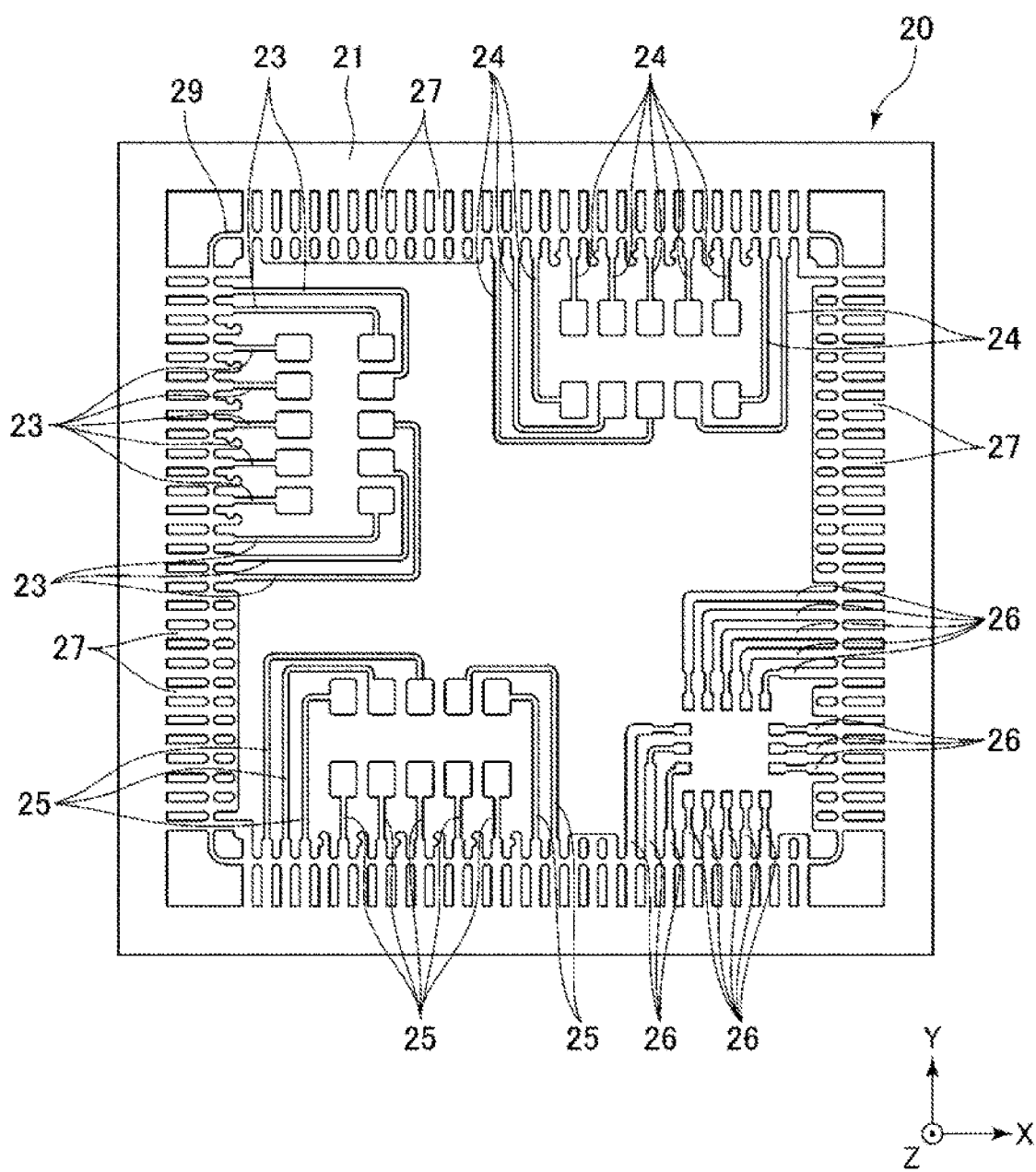
FIG. 5 is a diagram for explaining a manufacturing method of the electronic device shown in FIG. 1.
Figure 6:
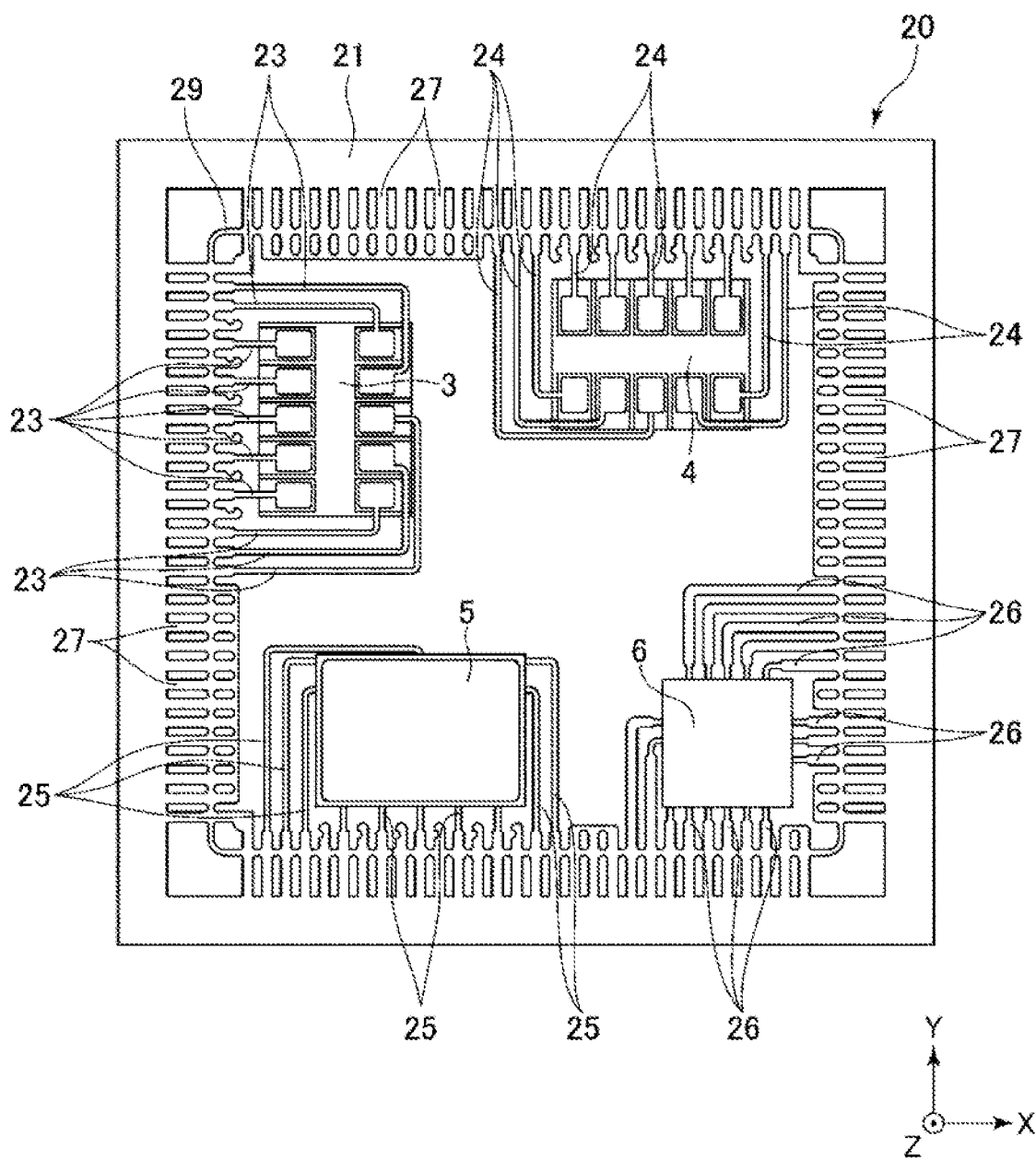
FIG. 6 is a diagram for explaining the manufacturing method of the electronic device shown in FIG. 1.
Figure 7:
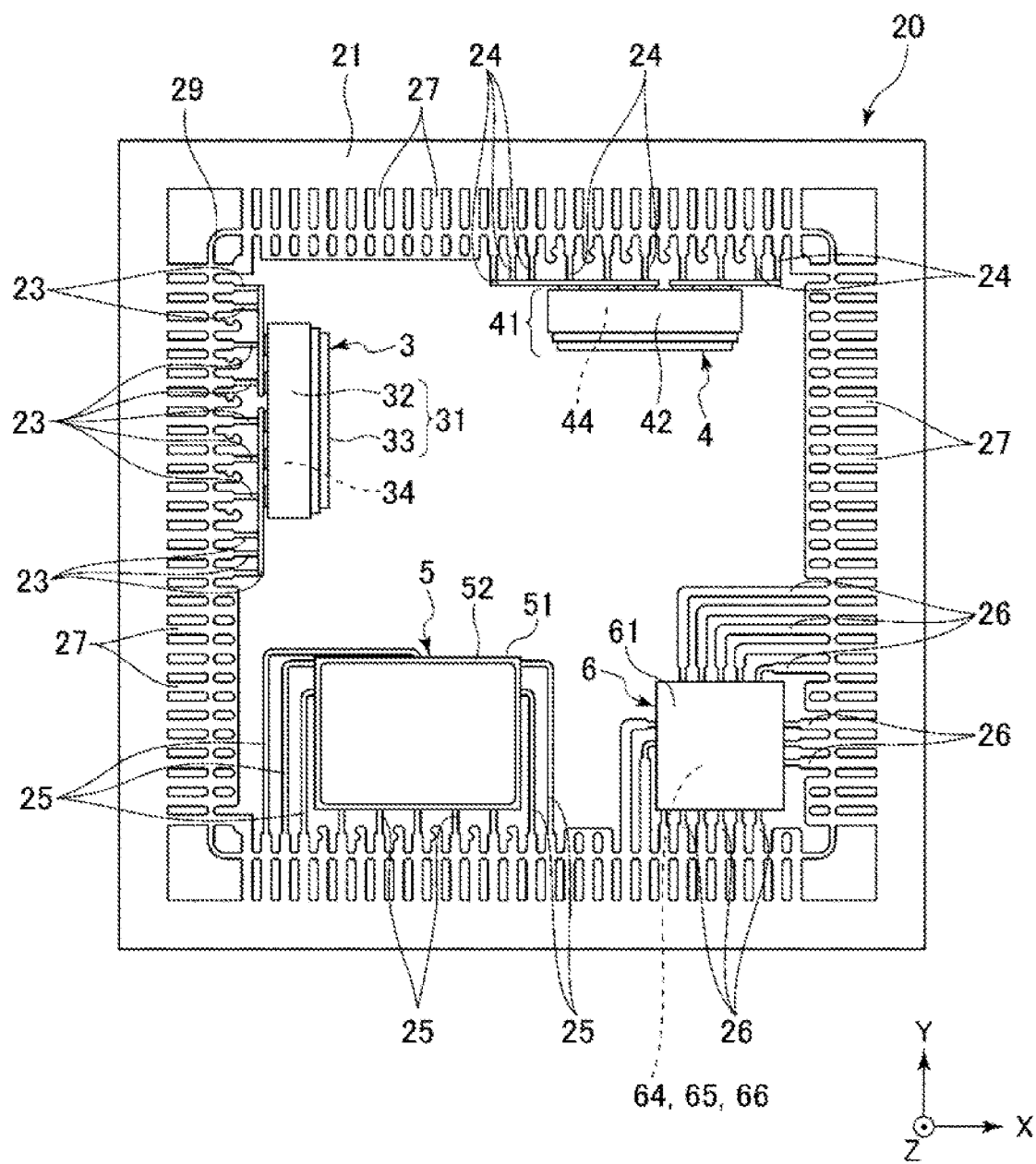
FIG. 7 is a diagram for explaining the manufacturing method of the electronic device shown in FIG. 1.

Firstly, as shown in FIG. 5, the lead frame 20 is prepared. The lead frame 20 has a frame 21 having a frame-like shape, the plurality of leads 23, 24, 25, 26, and 27 supported by the frame 21, and tie bars 29 coupling the leads 23, 24, 25, 26, and 27 to each other. Then, as shown in FIG. 6, the electronic component 3 is coupled to the plurality of leads 23 via the bonding material, the electronic component 4 is coupled to the plurality of leads 24 via the bonding material, the electronic component 5 is coupled to the plurality of leads 25 via the bonding material, and the electronic component 6 is coupled to the plurality of leads 26 via the bonding material. Then, as shown in FIG. 7, the plurality of leads 23 is folded 90° toward the positive side in the Z-axis direction at the folding point P in the middle of each of the leads 23 to erect the electronic component 3 to make the detection axis of the electronic component 3 coincide with the X axis. Further, the plurality of leads 24 is folded 90° toward the positive side in the Z-axis direction at the folding point P in the middle of each of the leads 24 to erect the electronic component 4 to make the detection axis of the electronic component 4 coincide with the Y axis.

Molding Process

Then, the electronic components 3, 4, 5, and 6 are disposed in the metal mold 8, the metal mold 8 is filled with the molding material M melted or softened, and then the molding material M is made to cure or solidified to thereby form the molded part 7 covering the electronic components 3, 4, 5, and 6. Here, in the detailed description of the metal mold 8, as shown in FIG. 8, the metal mold 8 is divided into a lower side metal mold 8A and an upper side metal mold 8B, and by sandwiching the lead frame 20 with the lower side metal mold 8A and the upper side metal mold 8B, it is possible to dispose the electronic components 3, 4, 5, and 6 inside the metal mold 8.

Figure 8:
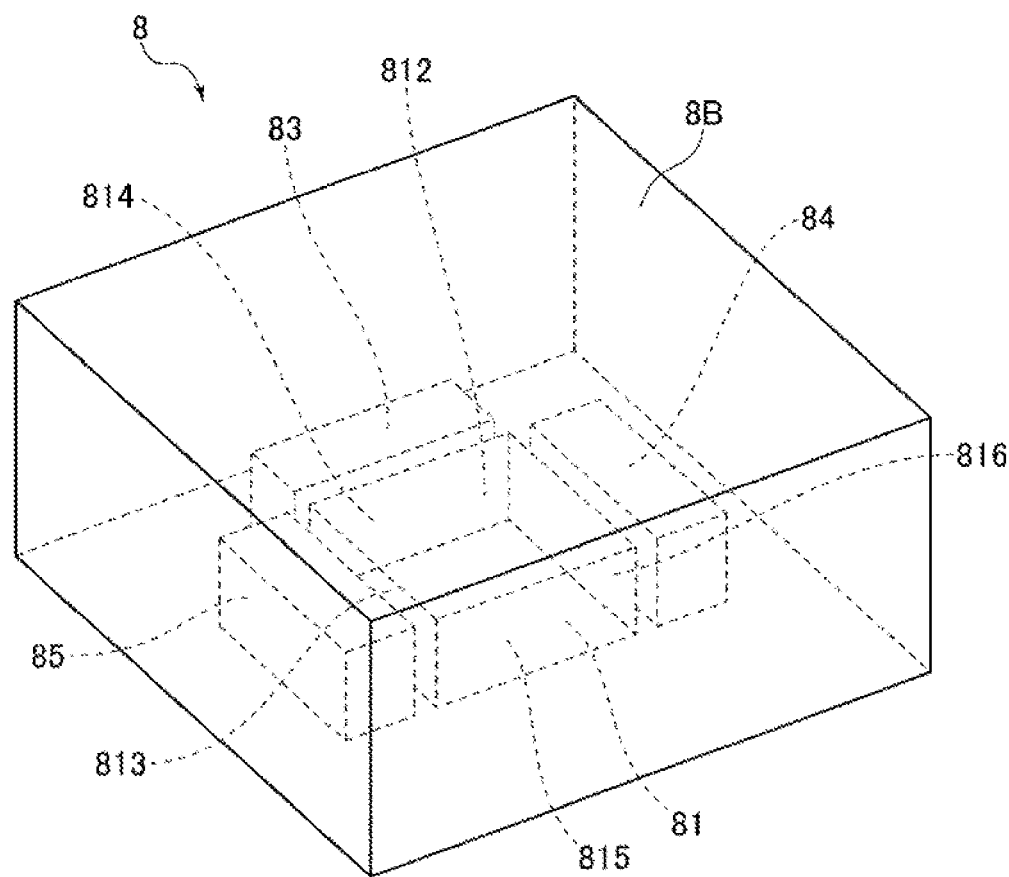
FIG. 8 is a diagram for explaining the manufacturing method of the electronic device shown in FIG. 1.
Figure 8:
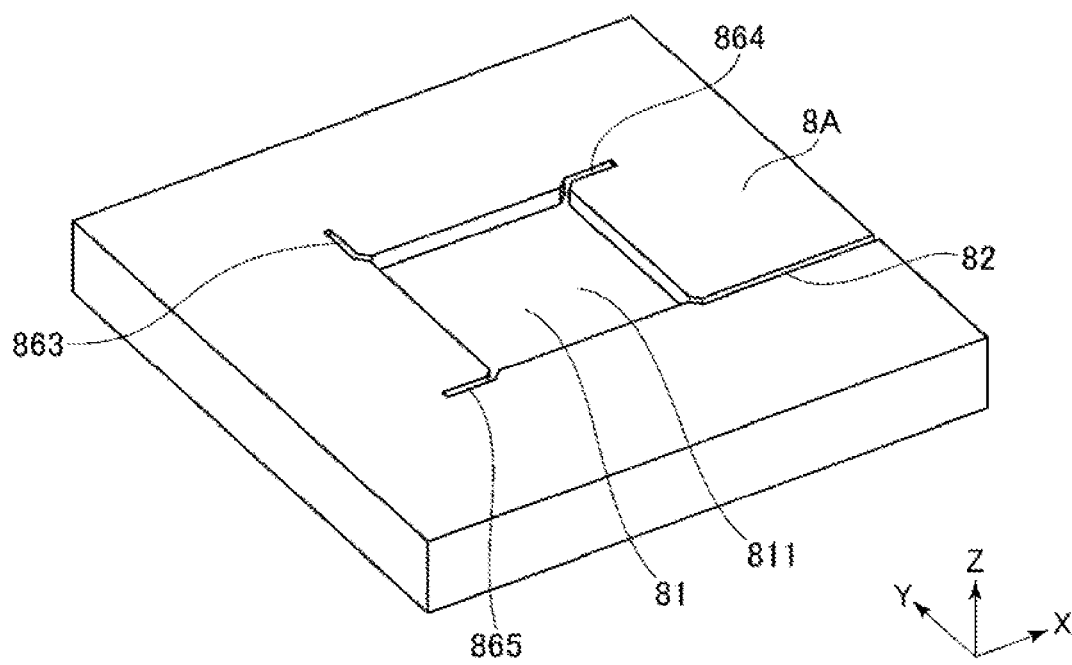

Further, as shown in FIG. 8, the metal mold 8 has a cavity for housing the electronic components 3, 4, 5, and 6, a dummy cavity 83 as a first dummy cavity communicated with the cavity 81, a dummy cavity 84 as a second dummy cavity, and a dummy cavity 85 as a third dummy cavity as spaces formed between the lower side metal mold 8A and the upper side metal mold 8B. Further, by filling the cavity 81 with the molding material M, the molded part 7 is formed, and it is possible to move a void B, namely a bubble which can be generated inside the cavity 81 to any of the dummy cavities 83, 84, and 85 together with the molding material M to remove the void B from the cavity 81.

The cavity 81 forms the same shape as the outer shape of the molded part 7, and has a rectangular shape in a plan view from the Z-axis direction. Such a cavity 81 includes a lower surface 811 located on the negative side in the Z-axis direction, an upper surface 812 located on the positive side in the Z-axis direction, and a first side surface 813, a second side surface 814, a third side surface 815, and the fourth side surface 816 coupling the lower surface 811 and the upper surface 812 to each other. Among the four side surfaces, the first side surface 813 and the fourth side surface 816 are opposed to each other in the X-axis direction, and the second side surface 814 and the third side surface 815 are opposed to each other in the Y-axis direction. Further, the first side surface 71 of the molded part 7 is formed of the first side surface 813, the second side surface 72 of the molded part 7 is formed of the second side surface 814, the third side surface 73 of the molded part 7 is formed of the third side surface 815, and the fourth side surface 74 of the molded part 7 is formed of the fourth side surface 816.

Figure 9:
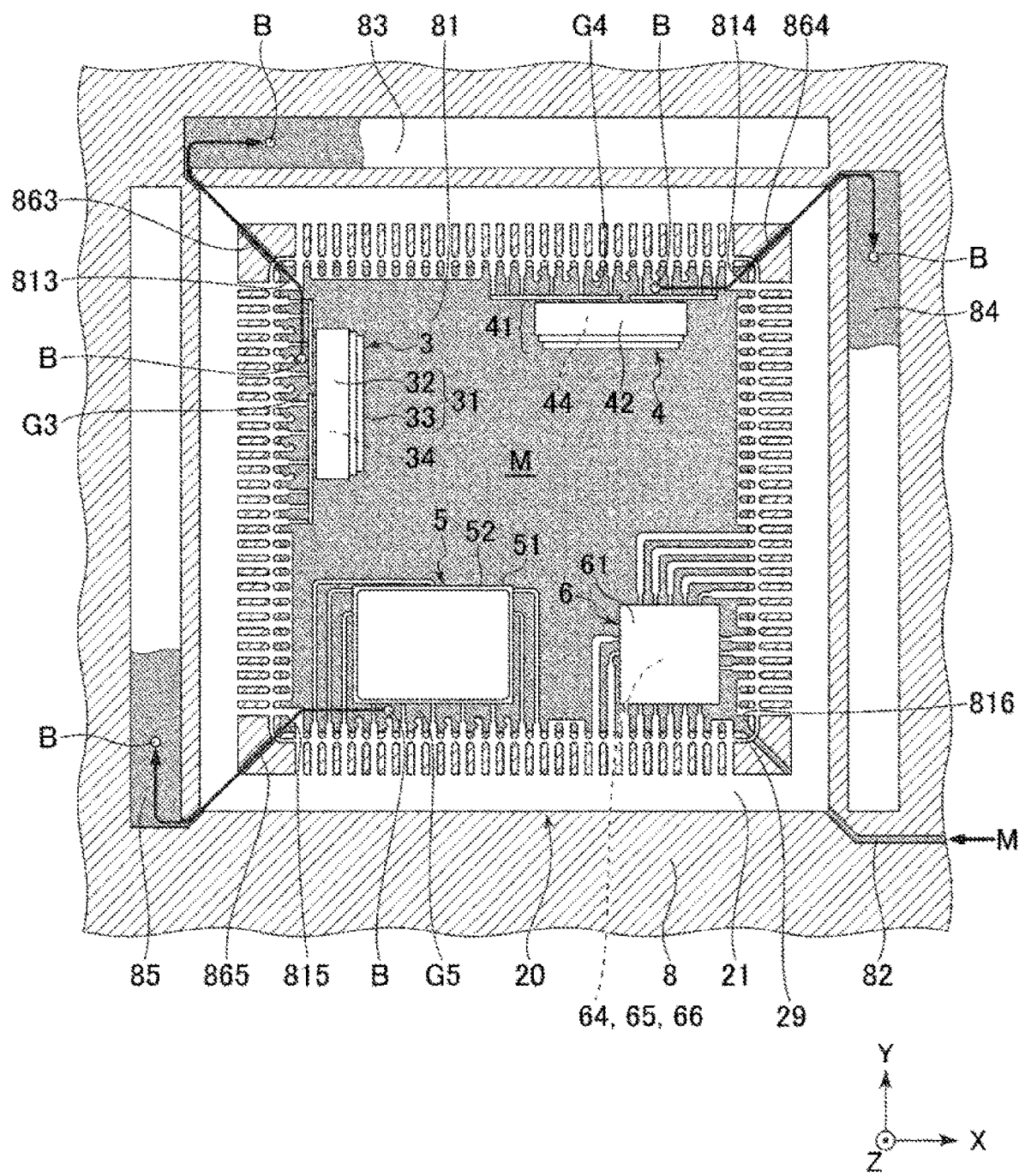
FIG. 9 is a diagram for explaining the manufacturing method of the electronic device shown in FIG. 1.

In such a cavity 81, there are disposed the electronic components 3, 4, 5, and 6 in a state of being mounted on the lead frame 20 in such a manner as shown in FIG. 9. The electronic component 3 is disposed along the first side surface 813 so as to be biased toward the second side surface 814 side on the first side surface 813. Further, the electronic component 4 is disposed along the second side surface 814 so as to be biased toward the fourth side surface 816 side on the second side surface 814. Further, the electronic component 5 is disposed along the third side surface 815 so as to be biased toward the first side surface 813 side on the third side surface 815. In other words, the electronic component 3 is disposed on the corner between the first side surface 813 and the second side surface 814, the electronic component 4 is disposed on the corner between the second side surface 814 and the fourth side surface 816, and the electronic component 5 is disposed on the corner between the first side surface 813 and the third side surface 815. Further, the electronic component 6 is disposed on the corner between the third side surface 815 and the fourth side surface 816.

Further, the metal mold 8 has an inflow channel 82 for making the resin material as the molding material M inflow into the cavity 81, namely a gate. The inflow channel 82 is communicated with the corner between the third side surface 815 and the fourth side surface 816 of the cavity 81. Although the electronic component 6 is disposed in the vicinity of the corner, the electronic component 6 is small in size with respect to the other electronic components 3, 4, and 5. Therefore, if the molding material M is made to inflow from the corner, it is possible to make the molding material M smoothly inflow into the cavity 81. Thus, it is possible to suppress the inflow pressure of the molding material M to a low level, and it is possible to effectively prevent the postures of the electronic components 3, 4, 5, and 6 from changing due to pressing by the molding material M, and the packages 31, 41, 51, and 61 of the electronic components 3, 4, 5, and 6 from being damaged. Therefore, it is possible to manufacture the electronic device 1 high in reliability. It should be noted that the arrangement of the inflow channel 82, in particular the coupling position to the cavity 81, is not particularly limited. Further, it is also possible to provide two or more inflow channels 82.

In the present embodiment, the inflow channel 82 is formed of a groove provided to the lower side metal mold 8A. Further, in other places of the lower side metal mold 8A, namely the places corresponding to the other three corners of the cavity 81, there are formed communication channels 863, 864, and 865 described later with grooves.

As described above, since the electronic component 3 is disposed along the first side surface 813, a gap G3 between the electronic component 3 and the first side surface 813 is smaller than gaps between the electronic component 3 and the second, third, and fourth side surfaces 814, 815, and 816. In other words, the distance between the electronic component 3 and the first side surface 813 is smaller than the distances between the electronic component 3 and the second, third, and fourth side surfaces 814, 815, and 816. Therefore, the molding material M is difficult to enter the gap G3, and thus, the void B is apt to occur in that part.

Similarly, since the electronic component 4 is disposed along the second side surface 814, a gap G4 between the electronic component 4 and the second side surface 814 is smaller than gaps between the electronic component 4 and the first, third, and fourth side surfaces 813, 815, and 816. In other words, the distance between the electronic component 4 and the second side surface 814 is smaller than the distances between the electronic component 4 and the first, third, and fourth side surfaces 813, 815, and 816. Therefore, the molding material M is difficult to enter the gap G4, and thus, the void B is apt to occur in that part.

Similarly, since the electronic component 5 is disposed along the third side surface 815, a gap G5 between the electronic component 5 and the third side surface 815 is smaller than gaps between the electronic component 5 and the first, second, and fourth side surfaces 813, 814, and 816. In other words, the distance between the electronic component 5 and the third side surface 815 is smaller than the distances between the electronic component 5 and the first, second, and fourth side surfaces 813, 814, and 816. Therefore, the molding material M is difficult to enter the gap G5, and thus, the void B is apt to occur in that part.

Further, the electronic components 3, 4, 5, and 6 act as obstacles in the cavity 81 to complicate the flow path of the molding material M, the molding material M flows into the gaps G3, G4, and G5 from both directions in some cases. Therefore, in the configuration of the present embodiment, the void B is more apt to occur in the gaps G3, G4, and G5.

Therefore, the metal mold 8 is configured so that the cavity 81 and the dummy cavities 83, 84, and 85 are communicated with each other in the vicinity of the gaps G3, G4, and G5, and thus, the void B generated in the gaps G3, G4, and G5 can effectively be guided to the inside of the dummy cavities 83, 84, and 85.

The dummy cavity 83 is a cavity corresponding to the electronic component 3, and is communicated with the cavity 81 via the communication channel 863 in the first side surface 813 having the smallest gap with the electronic component 3 out of the side surfaces 813 through 816. In particular, in the present embodiment, the dummy cavity 83 is communicated with the cavity 81 via the communication channel 863 in an end on the second side surface 814 side of the first side surface 813, namely the corner between the first side surface 813 and the second side surface 814. Thus, since the communication channel 863 is disposed in the vicinity of the gap G3, it is possible to more surely guide the void B generated in the gap G3 to the inside of the dummy cavity 83. Further, the corner is apt to become a dead end of the flow path of the molding material M, and therefore, in this regard, it is possible to more surely guide the void B generated in the gap G3 to the inside of the dummy cavity 83. Therefore, it is possible to more surely remove the void B from the inside of the cavity 81.

The dummy cavity 84 is a cavity corresponding to the electronic component 4, and is communicated with the cavity 81 via the communication channel 864 in the second side surface 814 having the smallest gap with the electronic component 4 out of the side surfaces 813 through 816. In particular, in the present embodiment, the dummy cavity 84 is communicated with the cavity 81 via the communication channel 864 in an end on the fourth side surface 816 side of the second side surface 814, namely the corner between the second side surface 814 and the fourth side surface 816. Thus, since the communication channel 864 is disposed in the vicinity of the gap G4, it is possible to more surely guide the void B generated in the gap G4 to the inside of the dummy cavity 84. Further, the corner is apt to become a dead end of the flow path of the molding material M, and therefore, in this regard, it is possible to more surely guide the void B generated in the gap G4 to the inside of the dummy cavity 84. Therefore, it is possible to more surely remove the void B from the inside of the cavity 81.

The dummy cavity 85 is a cavity corresponding to the electronic component 5, and is communicated with the cavity 81 via the communication channel 865 in the third side surface 815 having the smallest gap with the electronic component 5 out of the side surfaces 813 through 816. In particular, in the present embodiment, the dummy cavity 85 is communicated with the cavity 81 via the communication channel 865 in an end on the first side surface 813 side of the third side surface 815, namely the corner between the third side surface 815 and the first side surface 813. Thus, since the communication channel 865 is disposed in the vicinity of the gap G5, it is possible to more surely guide the void B generated in the gap G5 to the inside of the dummy cavity 85. Further, the corner is apt to become a dead end of the flow path of the molding material M, and therefore, in this regard, it is possible to more surely guide the void B generated in the gap G5 to the inside of the dummy cavity 85. Therefore, it is possible to more surely remove the void B from the inside of the cavity 81.

The configuration of the metal mold 8 is hereinabove described. Then, as described above, the electronic components 3, 4, 5, and 6 are sandwiched with the lower side metal mold 8A and the upper side metal mold 8B, and then the molding material M which is melted or softened to have fluidity is injected into the cavity 81 via the inflow channel 82 as shown in FIG. 9 in the state in which the electronic components 3, 4, 5, and 6 are housed in the cavity 81. On this occasion, a larger volume of the molding material M than the volume of the cavity 81, for example, the molding material M 1.2 through 3 times larger in volume than the volume of the cavity 81, is made to inflow into the cavity 81. Thus, the cavity 81 is filled with the molding material M, and at the same time, some of the molding material M inflows from the inside of the cavity 81 into the dummy cavities 83, 84, and 85 via the communication channels 863, 864, and 865 together with the bubble to form the void B. Thus, the void B is effectively removed from the inside of the cavity 81. Therefore, there is formed the molded part 7 in which occurrence of the void B is suppressed. When the cavity 81 is filled with the molding material M in such a manner as described above, the molding material M is made to cure or solidified.

As described above, since the metal mold 8 has a configuration in which it is easy to remove the void B generated inside the cavity 81 from the inside of the cavity 81, it is possible to suppress the inflow pressure of the molding material M to a sufficiently low level. Therefore, it is possible to effectively prevent a change in postures of the electronic components 3, 4, 5, and 6 and breakage of the electronic components 3, 4, 5, and 6, in particular, destruction of the packages 31, 41, 51, and 61. In other words, the metal mold 8 is more suitable to mold the electronic components 3, 4, 5, and 6 which do not allow the high inflow pressure of the molding material M. It should be noted that the arrangement and the shapes of the dummy cavities 83, 84, and 85 and the communication channels 863, 864, and 865 are not limited to those shown in the drawings.

Cutting Process

Then, after separating the molded part 7 from the metal mold 8, the frame 21 is cut and removed from the lead frame 20, and at the same time, the part projected from the molded part 7 of each of the leads 23, 24, 25, 26, and 27 is folded into a predetermined shape. Subsequently, the tie bars 29 for coupling the leads 23, 24, 25, 26, and 27 to each other are cut by a laser or the like. Further, burrs such as the molding material M in the inflow channel 82 and the communication channels 863, 864, and 865 or an unwanted molding material M are removed as needed. According to the process described hereinabove, the electronic device 1 shown in FIG. 1 is manufactured.

As described above, the method of manufacturing the electronic device 1 includes a process of housing the electronic components 3, 4, 5, and 6 in the metal mold 8 and then filling the metal mold 8 with the molding material M to form the molded part 7. Further, the metal mold 8 has a rectangular planar shape, and has the cavity 81, the dummy cavity 83, the dummy cavity 84, and the dummy cavity 85, wherein the electronic components 3, 4, 5, and 6 are housed in the cavity 81, the dummy cavity 83 is communicated with the first side surface 813 having the smallest gap with the electronic component 3 out of the four side surfaces included in the cavity 81, namely the first side surface 813, the second side surface 814, the third side surface 815, and the fourth side surface 816, the dummy cavity 84 is communicated with the second side surface 814 having the smallest gap with the electronic component 4, and the dummy cavity 85 is communicated with the third side surface 815 having the smallest gap with the electronic component 5. Further, in the process of forming the molded part 7, the molding material M inflows into the cavity 81, and then the molding material M in the cavity 81 inflows into the dummy cavities 83, 84, and 85.

In such a manufacturing method, the void B is apt to occur in the gap G3 between the electronic component 3 and the first side surface 813, the gap G4 between the electronic component 4 and the second side surface 814, and the gap G5 between the electronic component 5 and the third side surface 815, but the cavity 81 and the dummy cavities 83, 84, and 85 are communicated with each other in the vicinity of the gaps G3, G4, and G5, respectively, and therefore, it is possible to guide the void B generated in the gaps G3, G4, and G5 to the dummy cavities 83, 84, and 85 together with the molding material M. Therefore, it is possible to more surely prevent the void B from remaining in the molded part 7. Therefore, it is possible to more surely manufacture the electronic device 1 high in reliability.

Further, as described above, the dummy cavity 83 is communicated with the corner located in one end of the first side surface 813 having the smallest gap with the electronic component 3, namely the corner between the first side surface 813 and the second side surface 814 in the present embodiment. Further, the dummy cavity 84 is communicated with the corner located in one end of the second side surface 814 having the smallest gap with the electronic component 4, namely the corner between the second side surface 814 and the fourth side surface 816 in the present embodiment. Further, the dummy cavity 85 is communicated with the corner located in one end of the third side surface 815 having the smallest gap with the electronic component 5, namely the corner between the third side surface 815 and the first side surface 813 in the present embodiment.

Thus, the cavity 81 and the dummy cavity 83 become communicated with each other in the vicinity of the gap G3, the cavity 81 and the dummy cavity 84 become communicated with each other in the vicinity of the gap G4, and the cavity 81 and the dummy cavity 85 become communicated with each other in the vicinity of the gap G5. Further, the corners of the cavity 81 are each apt to become the dead end of the flow path of the molding material M. Therefore, by communicating the parts with the dummy cavities 83, 84, and 85, it is possible to more surely guide the void B to the inside of the dummy cavities 83, 84, and 85.

Further, as described above, the electronic device 1 has the plurality of electronic components 3, 4, and 5 covered with the molded part 7, and the plurality of dummy cavities 83, 84, and 85 are disposed for the plurality of electronic components 3, 4, and 5, respectively. In the present embodiment, the dummy cavity 83 is disposed so as to correspond to the electronic component 3, the dummy cavity 84 is disposed so as to correspond to the electronic component 4, and the dummy cavity 85 is disposed so as to correspond to the electronic component 5. Thus, since the void B generated in the gap G3 is guided to the dummy cavity 83, the void B generated in the gap G4 is guided to the dummy cavity 84, and the void B generated in the gap G5 is guided to the dummy cavity 85, it is possible to more surely remove the void B inside the cavity 81. It should be noted that this is not a limitation, but the void B generated in the gap G3 can be guided to the dummy cavities 84, 85, the void B generated in the gap G4 can be guided to the dummy cavity 83, 85, and the void B generated in the gap G5 can be guided to the dummy cavity 83, 84.

Further, as the electronic components, the electronic device 1 has the electronic component 3 as the first electronic component, the electronic component 4 as the second electronic component, and the electronic component 5 as the third electronic component as described above. Further, defining the four side surfaces of the cavity 81 as the first side surface 813, the second side surface 814 coupled to one end of the first side surface 813, the third side surface 815 coupled to the other end of the first side surface 813, and the fourth side surface 816 coupled to the second side surface 814 and the third side surface 815, the electronic component 3 is disposed in the cavity 81 so that the gap with the first side surface 813 becomes the smallest, the electronic component 4 is disposed in the cavity 81 so that the gap with the second side surface 814 becomes the smallest, and the electronic component 5 is disposed in the cavity 81 so that the gap with the third side surface 815 becomes the smallest. Further, as the dummy cavities, the metal mold 8 has the dummy cavity 83 as the first dummy cavity communicated with the first side surface 813, the dummy cavity 84 as the second dummy cavity communicated with the second side surface 814, and the dummy cavity 85 as the third dummy cavity communicated with the third side surface 815. By arranging the electronic components 3, 4, and 5 in such a manner, it is possible to arrange these electronic components 3, 4, and 5 regularly and in the small space. Therefore, reduction in size of the electronic device 1 can be achieved. Further, it is possible to arrange the dummy cavities 83, 84, and 85 so as not to interfere with each other.

Further, as described above, the metal mold 8 has the inflow channel 82 which is communicated with the corner located between the third side surface 815 and the fourth side surface 816, and allows the molding material M to inflow into the cavity 81. Since none of the electronic components 3, 4, and 5 is disposed in that part, it is possible to make the molding material M smoothly inflow into the cavity 81. Thus, it is possible to suppress the inflow pressure of the molding material M to a low level, and it is possible to effectively prevent the postures of the electronic components 3, 4, and 5 from changing due to pressing by the molding material M, and the packages 31, 41, and 51 of the electronic components 3, 4, and 5 from being destroyed.

Further, as described above, the electronic component 3 has the package 31 and the sensor element 34 housed in the package 31. Further, the electronic component 4 has the package 41 and the sensor element 44 housed in the package 41. Further, the electronic component 5 has the package 51 and the sensor element 54 housed in the package 51. The electronic component 6 has the package 61 and the sensor elements 64, 65, and 66 housed in the package 61. In the electronic components 3, 4, 5, and 6 having such a configuration, the packages 31, 41, 51, and 61 are apt to be destroyed due to the inflow pressure of the molding material M. According to the manufacturing method of the present embodiment, since the void B inside the cavity 81 can more surely be removed even when suppressing the inflow pressure of the molding material M to a low level as described above, it is possible to effectively prevent the destruction of the packages 31, 41, 51, and 61.

Although the method of manufacturing the electronic device according to the present disclosure is hereinabove described based on the embodiment shown in the drawings, the present disclosure is not limited to the embodiment, but the constituents of each of the sections can be replaced with those having an identical function and an arbitrary configuration. Further, it is also possible to add any other constituents to the present disclosure.

Figure 10:
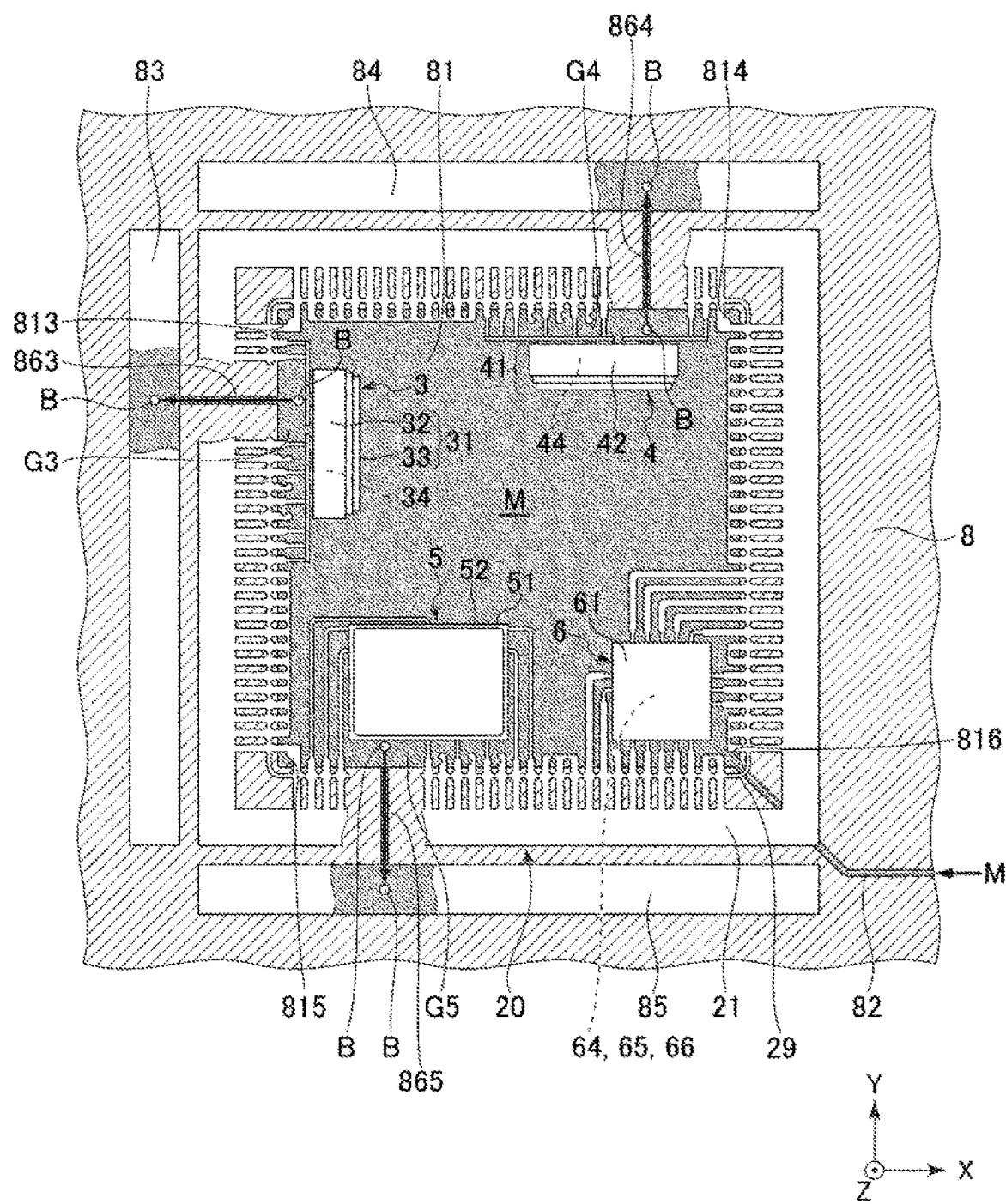
FIG. 10 is a diagram for explaining the manufacturing method of the electronic device shown in FIG. 1.

Further, although in the embodiment described above, there are disposed the three dummy cavities 83, 84, and 85 corresponding respectively to the electronic components 3, 4, and 5, this is not a limitation, and it is also possible to omit one or two of the dummy cavities 83, 84, and 85. Further, although in the embodiment described above, the dummy cavities 83, 84, and 85 are spaces independent of each other, this is not a limitation, and it is possible for the dummy cavities 83, 84, and 85 to be, for example, communicated with each other. In other words, it is also possible for the dummy cavities 83, 84, and 85 to form a single contiguous space. Further, for example, as shown in FIG. 10, it is possible for the cavity 81 and the dummy cavity 83 to be communicated with each other at a position in the middle of the first side surface 813 and overlapping the gap G3 in a plan view, it is possible for the cavity 81 and the dummy cavity 84 to be communicated with each other at a position in the middle of the second side surface 814 and overlapping the gap G4 in the plan view, and it is possible for the cavity 81 and the dummy cavity 85 to be communicated with each other at a position in the middle of the third side surface 815 and overlapping the gap G5 in the plan view. Thus, it is possible to communicate the cavity 81 with the dummy cavities 83, 84, and 85 at closer positions to the gaps G3, G4, and G5, respectively.

What is claimed is:

1. A method of manufacturing an electronic device having at least one electronic component covered with a molded part, the method comprising:
   housing a first electronic component in a metal mold, then filling the metal mold with a molding material to form the molded part, wherein
   the metal mold includes
      a housing cavity having a rectangular planar shape and housing the first electronic component, the housing cavity having four side surfaces,
      a first dummy cavity having a side surface facing a first side surface of the four side surfaces of the housing cavity;
      a second dummy cavity having a side surface facing a second side surface of the four side surfaces of the housing cavity;
      a first communication channel between the side surface of the first dummy cavity and the first side surface of the housing cavity; and
      a second communication channel between the side surface of the second dummy cavity and the second side surface of the housing cavity,
   wherein in the filling of the metal mold with the molding material, the molding material inflows into the housing cavity first, and the molding material in the housing cavity thereafter inflows into the first dummy cavity via the first communication channel, and inflows into the second dummy cavity via the second communication channel.

2. The method of manufacturing the electronic device according to claim 1, wherein
   the first dummy cavity is communicates with a corner located in one end of the first side surface, the first side surface having a smallest gap of all of the four side surfaces with the first electronic component.

3. The method of manufacturing the electronic device according to claim 1, wherein
   the electronic device further includes a second electronic component covered with the molded part,
   the second side surface having a smallest gap of all of the four side surfaces with the second electronic component.

4. The method of manufacturing the electronic device according to claim 3, wherein
   the electronic device further includes a third electronic component covered within the molded part,
   the second side surface coupled to one end of the first side surface, a third side surface of the four side surfaces of the housing cavity having a smallest gap of all of the four side surfaces with the third electronic component, the third side surface is coupled to another end of the first side surface,
   the metal mold including a third dummy cavity communicating with the third side surface.

5. The method of manufacturing the electronic device according to claim 4, a fourth side surface of the side surfaces of the housing cavity is coupled to the second side surface and the third side surface, wherein
   the metal mold includes an inflow channel communicating with a corner located between the third side surface and the fourth side surface to allow the molding material to inflow into the housing cavity.

6. The method of manufacturing the electronic device according to claim 1, wherein
   the electronic component includes a package and a sensor element housed in the package.

\* \* \* \* \*